(12) United States Patent
Larrieu et al.

(10) Patent No.: US 8,362,570 B2
(45) Date of Patent: Jan. 29, 2013

(54) METHOD FOR MAKING COMPLEMENTARY P AND N MOSFET TRANSISTORS, ELECTRONIC DEVICE INCLUDING SUCH TRANSISTORS, AND PROCESSOR INCLUDING AT LEAST ONE SUCH DEVICE

(75) Inventors: Guilhem Larrieu, Villeneuve d'ascq (FR); Emmanuel Dubois, Quesnoy sur Deule (FR)

(73) Assignee: Centre National de la Recherche Scientifique (C.N.R.S.) (FR)

( * ) Notice: Subject to any disclaimer, the term of this patent is extended or adjusted under 35 U.S.C. 154(b) by 0 days.

(21) Appl. No.: 12/937,193

(22) PCT Filed: Apr. 9, 2009

(86) PCT No.: PCT/FR2009/050642
§ 371 (c)(1),
(2), (4) Date: Feb. 9, 2011

(87) PCT Pub. No.: WO2009/136095
PCT Pub. Date: Nov. 12, 2009

(65) Prior Publication Data
US 2011/0121400 A1 May 26, 2011

(30) Foreign Application Priority Data
Apr. 11, 2008 (FR) ...................... 08 52464

(51) Int. Cl.
*H01L 21/02* (2006.01)
(52) U.S. Cl. ............. 257/382; 257/E21.2; 257/E23.157; 438/570

(58) Field of Classification Search ................... 257/382, 257/E21.2, E23.157; 438/570
See application file for complete search history.

(56) References Cited

U.S. PATENT DOCUMENTS

| 4,485,550 | A | 12/1984 | Koeneke et al. | |
|---|---|---|---|---|
| 7,052,945 | B2 * | 5/2006 | Snyder | 438/197 |
| 7,074,673 | B2 * | 7/2006 | Forbes | 438/257 |
| 2004/0014276 | A1 * | 1/2004 | Murthy et al. | 438/231 |
| 2007/0057347 | A1 | 3/2007 | Ikeda | |
| 2008/0116494 | A1 * | 5/2008 | Goldbach et al. | 257/288 |

FOREIGN PATENT DOCUMENTS

| EP | 1763084 | 3/2007 |
|---|---|---|
| GB | 2124428 | 2/1984 |

OTHER PUBLICATIONS

Bera et al., "Dopant-Segregated Ni-Silicide Schottky-Source/Drain CMOS on Strained-Si/SiGe Multiple Quantum-Well Channel on Bulk-Si," *Solid-State Device Research Conference, Proceeding of the 36th European, IEEE*, pp. 290-293 (2006.

(Continued)

*Primary Examiner* — William D Coleman
(74) *Attorney, Agent, or Firm* — Barnes & Thornburg LLP

(57) ABSTRACT

This method for making complementary p and n MOSFET transistors with Schottky source and drain electrodes controlled by a gate electrode, comprising: making source and drain electrodes from a single silicide for both p and n transistors; segregating first impurities from groups II and III of the periodic table at the interface between the silicide and the channel of the p transistor, the complementary n transistor being masked; and segregating second impurities from groups V and VI of the periodic table, at the interface between the silicide and the channel of the n transistor, and the complementary p transistor being masked.

14 Claims, 9 Drawing Sheets

OTHER PUBLICATIONS

Kinoshita et al., "High-performance 50-nm-gate-length schottky-source/drain MOSFETs with dopant-segregation junctions" *VLSI Technology, Digest of Technical Papers, Symposium on Kyoto, Japan,IEEE*, pp. 158-159 (2005).

Matsumoto et al., "CMOS Application of Schottky Source/Drain SOI MOSFET With Shallow Doped Extension," *Japanese Journal of Applied Physics*, 43(4B): 2170-2175 (2004).

Qiu et al., "Role of Si implantation in control of underlap length in Schottky-barrier source/drain MOSFETs on ultrathin body SOI," *Ultimate Integration of Silicon, ULIS, 9th International Conference on, IEEE*, pp. 175-178 (2008).

Zhijun et al., "A Comparative Study of Two Different Schemes to Dopant Segregation at NiSi/Si and PtSi/Si Interfaces for Schottky Barrier Height Lowering," *IEEE Transactions on Electron Devices, IEEE Service Center*, 54(1): 396-403 (2008).

International Technology Roadmap for Semiconductors (ITRS), *Executive Summary*, retrieved online at: http://www.itrs.net/Links/2005itrs/home2005.htm (2005).

* cited by examiner

METHOD FOR MAKING COMPLEMENTARY P AND N MOSFET TRANSISTORS, ELECTRONIC DEVICE INCLUDING SUCH TRANSISTORS, AND PROCESSOR INCLUDING AT LEAST ONE SUCH DEVICE

This patent application is a U.S. nationalization under 35 USC §371 of International Application No. PCT/FR2009/050642, filed Apr. 9, 2009, which claims priority to French Patent Application No. FR0852464, filed Apr. 11, 2008. The disclosures set forth in the referenced applications are incorporated herein by reference in their entireties.

BACKGROUND

The present disclosure concerns a method for making complementary p and n MOSFET transistors, with metal source and drain Schottky electrodes arranged on a semiconductor substrate, the source and drain electrodes of each transistor being connected by a channel controlled by a gate electrode.

The disclosure also concerns an electronic device, of the type comprising at least one p transistor and at least one n transistor, each of the transistors including a metal source and drain Schottky electrode, formed from a silicide arranged on a semiconductor substrate, the source and drain electrodes of each transistor being connected by a channel controlled by a gate electrode.

The disclosure also concerns a processor including such an electronic device, as illustrated in FIG. 15.

U.S. Pat. No. 7,052,945 B2 describes a method for making complementary p and n MOSFET transistors, with metal source and drain Schottky electrodes arranged on a semiconductor substrate. The production of the source and drain electrodes for each p transistor is done from a platinum silicide, palladium silicide or iridium silicide. The production of the source and drain electrodes for each n transistor is done from a rare earth-based silicide, such as erbium. The source and drain electrodes of each transistor are connected by a channel. The channel of each p transistor is doped with an element from the group consisting of: arsenic, phosphorous and antimony. The channel of each n transistor is doped with an element from the group consisting of: boron, indium and gallium. This method makes it possible to obtain, for each p and n transistor, a channel with a length smaller than 100 nanometers, the length of the channel being the distance separating the source and drain electrodes, connected by said channel.

According to the ITRS (International Technology Roadmap for Semiconductors) 2005 roadmap published by the Semiconductor Industries Association in 2005, the bottlenecks for the technological node corresponding to a gate length of 18 nm are in particular the following:

I: high solubility of the dopant and very low depth of the extensions of the source and drain electrodes at their junction with the channel ($x_j$=5.1 nm), II: an abrupt concentration gradient at the junctions between the channel and the source and drain electrodes (less than 1 nm/decade), III: a very small silicide thickness (10 nm), IV: a reduced silicon consumption during the silicide formation (less than 8.4 nm), V: a very low resistance per silicide square (15.8 $\Omega/\square$ for a silicide thickness of 10 nm), VI: a very low specific contact resistance of the source electrode and drain electrode at the interface between the silicide and the channel (less than $5.4 \times 10^{-9}$ $\Omega \times cm^2$), and VII: a low total contact resistance (from 60 to 80 $\Omega \times \mu m$).

The complementary p and n MOSFET transistors described in U.S. Pat. No. 7,052,945 B2 make it possible to guard against bottlenecks I and II, the junctions between the source and drain Schottky electrons and the channel not being doped, and to guard against bottlenecks III to V, the thickness of silicide not being limited for the source and drain Schottky electrodes.

However, the complementary p and n MOSFET transistors described in U.S. Pat. No. 7,052,945 B2 have Schottky barrier heights in the vicinity of 0.2 eV. For the source and drain electrodes of the p transistor, produced from a platinum silicide, the Schottky barrier height is substantially equal to 0.15 eV. For the source and drain electrodes of the n transistor, produced from a rare earth-based silicide such as ytterbium, erbium, respectively, the Schottky barrier height is substantially equal to 0.2 eV, 0.25 eV, respectively. These relatively high Schottky barrier heights do not make it possible to resolve technological bottlenecks VI and VII described above. They also do not make it possible to obtain performance comparable to the performance obtained with MOSFET transistors made using a traditional approach, i.e. MOSFET transistors with strongly doped junctions between the channel and the source and drain electrodes. Indeed, a high barrier height prevents one from obtaining a satisfactory specific contact resistance for the source and drain electrodes.

Moreover, the method for making complementary p and n MOSFET transistors, described in U.S. Pat. No. 7,052,945 B2 is relatively complex, since it involves integrating rare earth-based silicide to made source and drain electrodes of n transistors. The integration of rare earths is very sensitive to oxygen and must be done in an ultrahigh vacuum, this term being used to designate very high vacuums.

SUMMARY

The disclosure therefore aims to significantly simplify the production of complementary p and n MOSFET transistors, with Schottky source and drain electrodes, and to substantially decrease the Schottky barrier height for the source and drain electrodes of said complementary MOSFET transistors, in order to minimize the specific contact resistances of the source and drain electrodes.

To that end, the disclosure concerns a production method of the aforementioned type, characterized in that it comprises:
making source and drain electrodes from a single silicide for both p and n transistors, arranged on the semiconductor substrate,
segregating first impurities from groups II and III of the periodic table at the interface between the silicide and the channel of the p transistor, to make source and drain electrodes of the p transistor, the complementary n transistor being masked,
segregating second impurities from groups V and VI of the periodic table, at the interface between the silicide and the channel of the n transistor, to make source and drain electrodes of the n transistor, the complementary p transistor being masked.

According to other embodiments, the production method comprises one or several of the following features, alone or in any technically possible combination:
the single silicide is an alloy comprising silicon and platinum, the single silicide is an alloy comprising nickel and silicon, the method comprises the selection of said substrate from the group consisting of: solid silicon, silicon on insulator, silicon on nothing and a germanium-based substrate, the method comprises the selection of a technology for making said channel among the group consisting of a non-strained channel, a channel strained by using a substrate of strained silicon on insulator, a channel strained by selective epitaxy of source and drain zones, a channel with a layer of strained dielectric material, a flanged channel, and a nanowire-based channel.

the method comprises, for p transistors, the selection of the first impurities from the list of elements of group II consisting of: beryllium, magnesium, calcium, strontium and barium, the method comprises, for p transistors, the selection of the first elements from the list of elements of group III consisting of boron, aluminum, gallium and indium, the method comprises, for n transistors, the selection of the second impurities from the list of elements of group V consisting of: phosphorous, arsenic and antimony, the method comprises, for n transistors, selecting second impurities from the list of elements of group VI consisting of: sulfur, selenium and tellurium.

the concentration of the segregated first and second impurities is between $5 \times 10^7/cm^3$ and $5 \times 10^{21}/cm^3$, the segregation of the first and second impurities is done by an implantation among the group consisting of: implantation in silicide, implantation in metal and implantation before silicide, the segregation of the first and second impurities is done by implantation in silicide, and the method comprises the steps of:

implanting the first impurities, formed by an element from groups II and III of the periodic table of elements, in the silicide to make source and drain electrodes of the p transistor, the complementary n transistor being masked, implanting the second impurities, formed from an element from groups V and VI of the periodic table of elements, in the silicide to make the source and drain electrodes of the n transistor, the complementary p transistor being masked, segregating the first and second impurities at the interface between the silicide and the channel via an activation by low-temperature annealing, the annealing temperature for the single activation of the step for segregating first and second impurities is less than 700° Celsius.

Another subject-matter of the disclosure is an electronic device of the aforementioned type, characterized in that there is a single silicide for the source and drain electrodes of the p and n transistors, and in that the source and drain electrodes of the p transistor comprise first impurities segregated at the interface between the silicide and the channel of the p transistor, the first impurities being elements from groups II and III of the periodic table, and in that the source and drain electrodes of the n transistor comprise second impurities segregated at the interface between the silicide and the channel of the n transistor, the second impurities being elements from groups V and VI of the periodic table.

According to another embodiment, the electronic device comprises the following feature:

the device belongs to the group consisting of: a CMOS inverter circuit, a logic gate, a multiplexor, a volatile memory and a non-volatile memory.

Another subject-matter of the disclosure is a processor 150, as illustrated in FIG. 15, characterized in that it includes at least one electronic device 100 as defined above.

BRIEF DESCRIPTION OF THE DRAWINGS

The disclosure and its advantages will be better understood upon reading the following description, provided solely as an example and done in reference to the appended drawings, in which.

DETAILED DESCRIPTION

Figure 1:
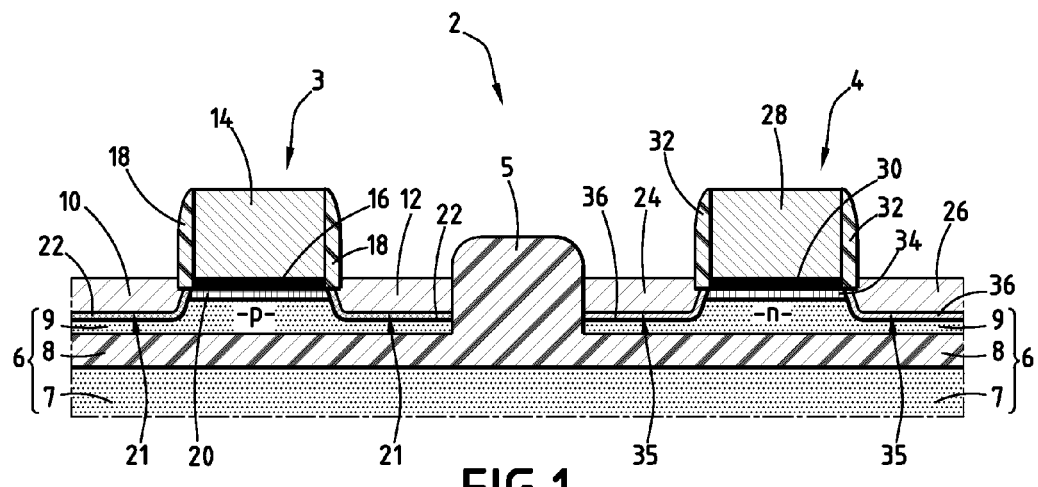
FIG. 1 is a diagrammatic cross-sectional illustration of an electronic device for a silicon on insulator substrate, the silicide not having consumed all of the silicon film, according to a first embodiment of the disclosure.

In FIG. 1, an electronic device 2 comprises a p MOSFET transistor 3 and a complementary n MOSFET transistor 4. The p MOSFET transistor 3 is separated from the n MOSFET transistor 4 by an insulating zone 5. The complementary MOSFET transistors 3, 4 are made on a semiconductor substrate 6. In the described embodiment, the substrate 6 is a silicon on insulator (SOI).

The SOI substrate 6 is formed from a silicon wafer 7 successively covered with an insulating layer 8 and a thin layer 9 of silicon. The insulating layer 8 is, for example, a layer of silica ($SiO_2$). The thin layer 9, or active layer, has a thickness smaller than 30 nm, preferably between 2 and 15 nm. The active layer 9, completely depleted, is slightly doped, for example, in the vicinity of $5\times10^{15}$ to $5\times10^{17}$ cm$^{-3}$. The doping is of the p type for the p MOSFET transistor 3, and of the n type for the n MOSFET transistor 4.

The p MOSFET transistor 3 comprises a source electrode 10, a drain electrode 12 and a gate electrode 14. The gate electrode 14 is electrically insulated from the rest of the structure by a gate insulating layer 16 and by the insulating struts 18 arranged on either side of the gate electrode 14.

The source 10 and drain 12 electrodes are aligned on the gate electrode 14. The source 10 and drain 12 electrodes are connected by a channel 20. For each source 10 and drain 12 electrode, first impurities 21 are segregated in an interface area 22 between the corresponding electrode 10, 12 and the channel 20 on one hand, and between the corresponding electrode 10, 12 and the substrate 6 on the other hand.

The n MOSFET transistor 4 comprises a source electrode 24, a drain electrode 26 and a gate electrode 28. The gate electrode 28 is electrically insulated from the rest of the structure by an insulating gate layer 30 and by insulating struts 32 arranged on either side of the gate electrode 28.

The source 24 and drain 26 electrodes are aligned on the gate electrode 28. The source 24 and drain 26 electrodes are connected by a channel 34. For each source 24 and gate 26 electrode, second impurities 35 are segregated in an interface zone 36, between the corresponding electrode 24, 26 and the channel 34 on one hand, and between the corresponding electrode 24, 26 and the substrate 6 on the other hand.

The source 10, 24 and drain 12, 26 electrodes of the p and n transistors 3, 4 are metal Schottky electrodes and are formed from a single silicide. The single silicide is, for example, an alloy of silicon and platinum (PtSi).

Each channel 20, 34 is, for example, a non-strained channel. Each channel 20, 34 is capable of being controlled by the corresponding gate electrode 14, 28 between an off mode and an on mode. In the off mode, the current circulating in the channel 20, 34 between the source electrode 10, 24 and the drain electrode 12, 26 is substantially null. In the on mode, charge carriers move substantially freely in the channel 20, 34, the current circulating from the source electrode 10, 24 toward the drain electrode 12, 26.

The carriers constituting the channel 20, 34 are the main carriers of the active layer 9, i.e. electrons for n doping and holes for p doping.

Each gate electrode 14, 28 is made of metal, for example tungsten. Each insulating layer 16, 30 is made of thermal oxide, for example silica ($SiO_2$). Each insulating strut 18, 32 is made from a dielectric material, for example silicon nitride (SiN).

The first impurities 21 segregated in each interface zone 22 of the p MOSFET transistor are elements from groups II and III of the periodic table of elements. In the described embodiment, the first impurities 21 are boron.

The second impurities 35 segregated in each interface zone 36 of the n MOSFET transistor are elements from groups V and VI of the periodic table of elements. In the described embodiment, the second impurities 35 are arsenic.

The concentration of segregated impurities 21, 35 is between $5\times10^7$/cm$^3$ and $5\times10^{21}$/cm$^3$, preferably equal to $5\times10^{20}$/cm$^3$.

The method for manufacturing the electronic device 2 will now be described using FIGS. 2 to 6.

The production method begins by producing the SOI substrate 6, by forming the insulating zone 5, and by doping the active layer 9 according to the p, n type of the transistors 3, 4.

Figure 2:
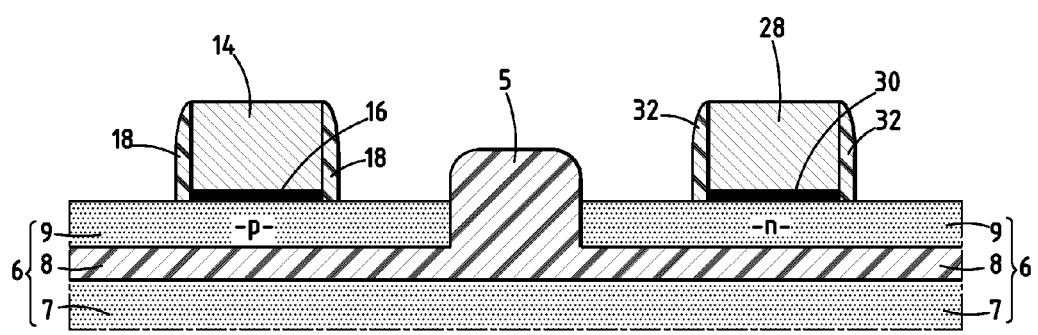
FIG. 2 is a diagrammatic illustration of a formation step of the gate electrode, of the production method according to the first embodiment of the disclosure.

The production method continues by forming insulating layers 16, 30, covered with corresponding gate electrodes 14, 28, as shown in FIG. 2. The dielectric struts 18, 32 are then made on each side of the corresponding gate electrode 14, 28, by isotrope deposition and anisotrope plasma etching.

Figure 3:
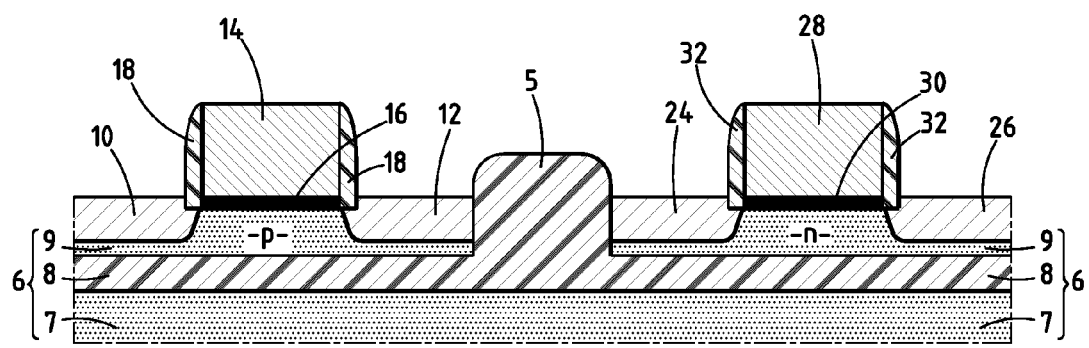
FIG. 3 is a diagrammatic illustration of a step for formation of a single silicide of the source and drain electrodes, of the production method according to the first embodiment of the disclosure.

The production method continues by a step for forming the single silicide, as shown in FIG. 3. The single silicide is formed from a base of an alloy of silicon and platinum (PtSi) in the zones of the source 10, 24 and drain 12, 26 electrodes. In the described embodiment, the thickness of the thin layer 9 of silicon of the substrate 6 is not completely consumed by the silicide. A fine layer of silicon remains between the zones of the source 10, 24 and drain 12, 26 electrodes, on one hand, and the insulating layer 8 on the other. When the silicide is formed, the zones of the source 10, 24 and drain 12, 26 electrodes are auto-aligned on the gate electrodes 14, 28.

Figure 4:
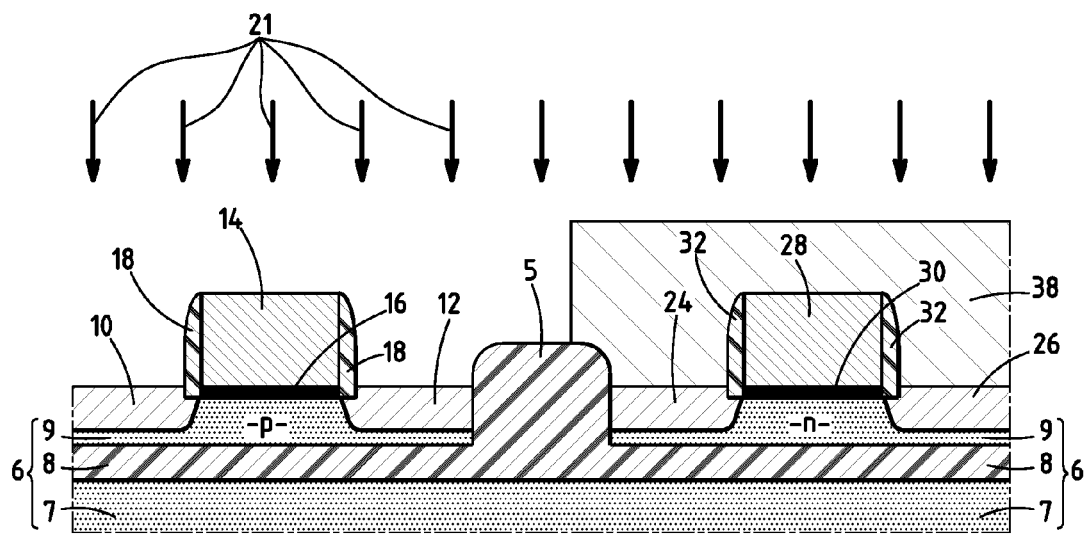
FIG. 4 is a diagrammatic illustration of a step for implantation of impurities from group II or III in the silicide of the source and drain electrodes of a p transistor, of the production method according to the first embodiment of the disclosure.
Figure 5:
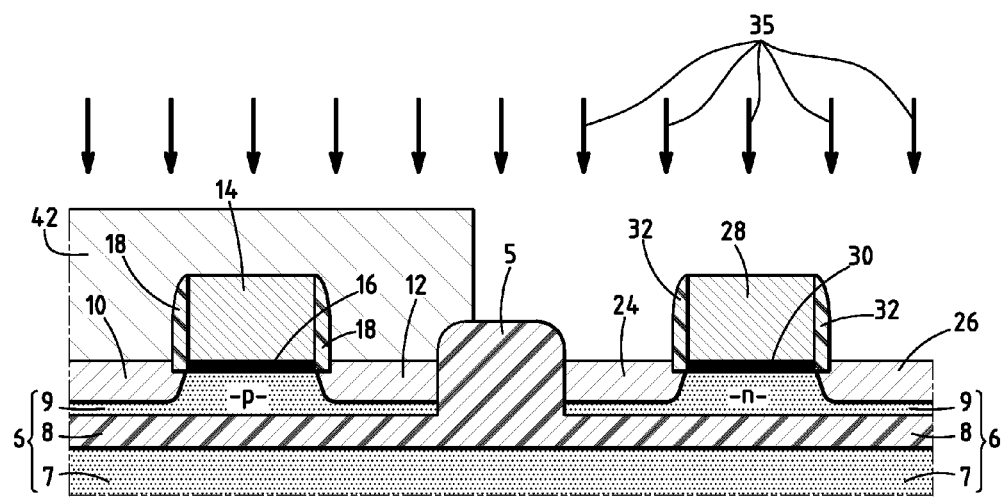
FIG. 5 is a diagrammatic illustration of a step for implantation of impurities from group V or VI in the silicide of the source and drain electrodes of an n transistor, of the production method according to the first embodiment of the disclosure.
Figure 6:
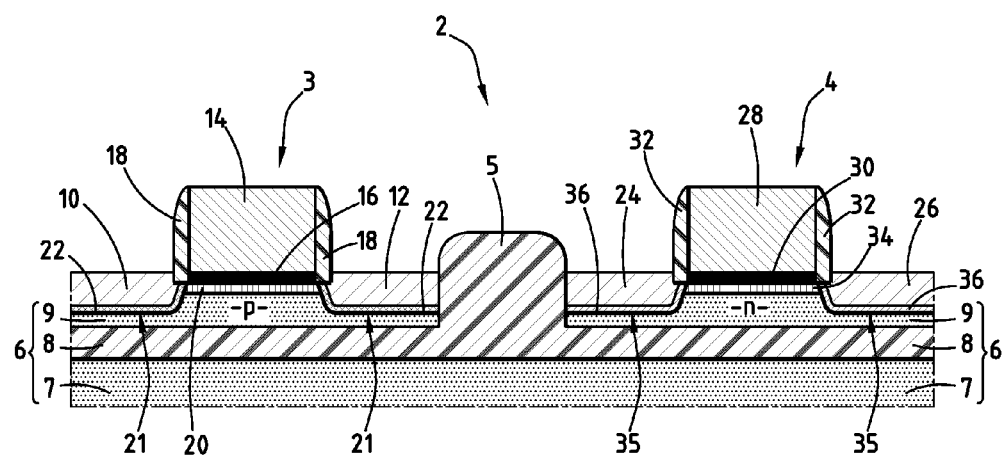
FIG. 6 is a diagrammatic illustration of a step for segregating impurities at the interface between the silicide and the channel for p and n transistors, via an activation through low-temperature annealing, of the production method according to the first embodiment of the disclosure.

In the described embodiment, the segregation of the impurities 21, 35 at the interface between the silicide of the source 10, 24 and drain 12, 26 electrodes, and the channel 20, 34 is done by an implantation to silicide (ITS), as shown in FIGS. 4 to 6.

The following step of the production method, shown in FIG. 4, consists of confining, by ionic implantation, the first impurities 21 from groups II and III of the periodic table, in the silicide of the zone of the source 10 and drain 12 electrodes. In the described embodiment, the first impurities 21 implanted in the zones 10, 12 are boron atoms. The zones of the source 24 and drain 26 electrodes, as well as the gate electrode 28, are protected by a mask 38, so that the first boron impurities 21 do not implant themselves there.

The density of the silicide being four times greater than that of silicon, the boron impurities 21 are quickly halted in the silicide layer of the zones of the source 10 and drain 12 electrodes during the ion implantation. The metal gate electrode 14 serves as a screen during that implantation, such that the boron impurities 21 do not reach the portion of the active layer 9 situated between the zones of the source 10 and drain 12 electrodes. After implantation, the boron impurities 21 are therefore primarily located in the zones of the source 10 and drain 12 electrodes, in relation to a very small minority having reached the active layer 9.

The next step of the production method, shown in FIG. 5, is a step for implanting second impurities 35 from groups V and VI of the periodic table of elements, in the silicide of the zones of the source 24 and drain 26 electrodes. In the described embodiment, the second impurities 35 confined in the zones of the source 24 and drain 26 electrodes are arsenic atoms. The zones of the source 10 and drain 12 electrodes as well as the gate electrode 14 are protected by a mask 42, so that the second arsenic impurities 35 do not implant themselves there. Identically to the implantation step of the first impurities 21 previously described, and due to the density of the silicide four times greater than that of the silicon and the screen role of the metal gate electrode 28, the second arsenic impurities 35 are primarily located in the zones of the source 24 and drain 26 electrodes in relation to a small minority having reached the active layer 9.

The last step, visible in FIG. 6, of the method for making the electronic device 2 consists of a low-temperature annealing step, in order to segregate the first and second impurities 21, 35 previously implanted, at the interface between the silicide of each source 10, 24 and drain electrode 12, 26 and the corresponding channel 20, 34, on one hand, and between the silicide of each source 10, 24 and drain 12, 26 electrode and the substrate 6 on the other hand. The annealing temperature is less than 700° Celsius, preferably equal to 600° Celsius.

The operating principle of the electronic device 2 is that of a MOS accumulation transistor. The carriers constituting the channel 20 of the p MOSFET transistor are holes and the carriers constituting the channel 34 of the n MOSFET transistor are electrons. The conduction of each channel 20, 34 is controlled by the supply voltage $V_{GS}$ applied between each gate electrode 14, 28 and each corresponding source electrode 10, 24.

For simplification, the supply voltage $V_{GS}$ applied between each gate electrode 14, 28 and each corresponding source electrode 10, 24 is called supply voltage Vg of the gate electrode 14, 28. The supply voltage $V_{DS}$ applied between each drain electrode 12, 26 and each corresponding source electrode 10, 24 is called supply voltage Vd of the drain electrode 12, 26. The current $I_{DS}$ circulating between each drain electrode 12, 26 and each corresponding source electrode 10, 24 is called drain current Id.

Figure 7:
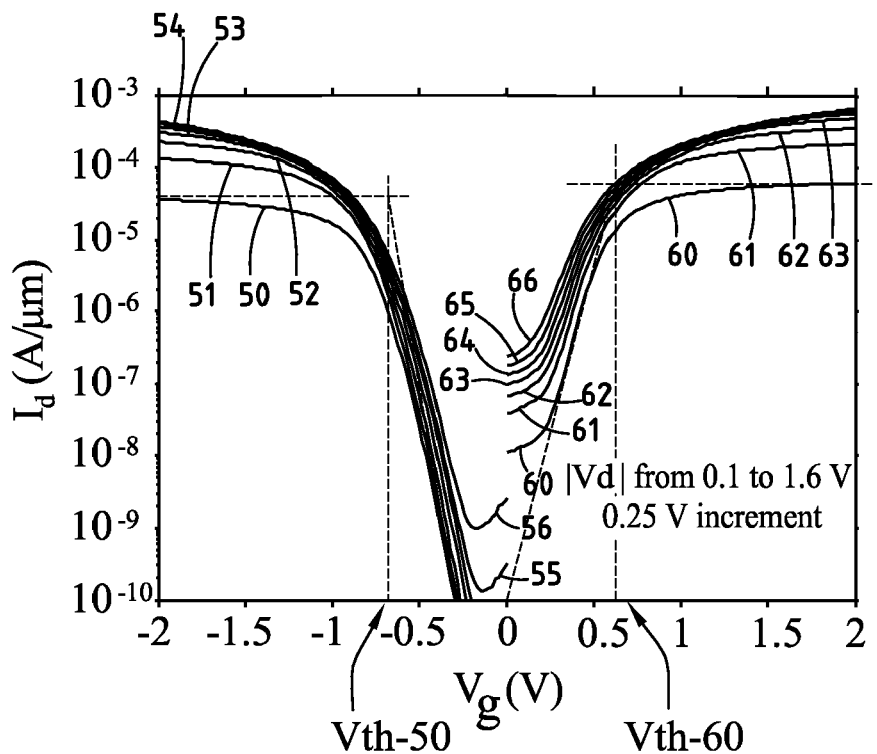
FIG. 7 is a set of curves showing the evolution of the drain current as a function of the supply voltage of the gate electrode, for supply voltages of the drain electrode varying in absolute value from 0.1 V to 1.6 V by 0.25 V increments, for the complementary p and n MOSFET transistors, according to the first embodiment of the disclosure.
Figure 8:
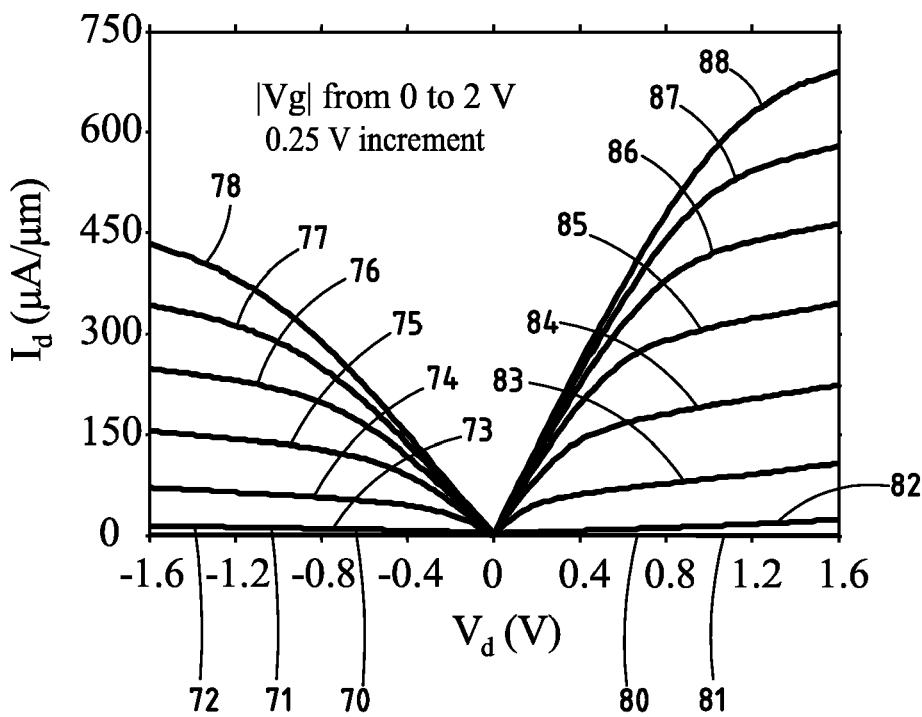
FIG. 8 is a set of curves showing the evolution of the drain current as a function of the supply voltage of the drain electrode, for a supply voltage of the gate electrode varying in absolute value from 0 V to 2 V by 0.25 V increments, for complementary p and n MOSFET transistors, according to the first embodiment of the disclosure.

FIGS. 7 and 8 illustrate electrical performance obtained for MOSFET transistors 3, 4, whereof the length of the tungsten gate electrode 14, 28 is equal to 70 nm and whereof the thickness of the thermal oxide insulating layer 16, 30 is equal to 2.4 nm, with an annealing temperature equal to 600° Celsius to activate the impurities 21, 35.

In FIG. 7, curves 50 to 56 show the evolution of the drain current Id as a function of the supply voltage Vg of the gate electrode 14, for a supply voltage Vd of the drain electrode 12 varying from −0.1 V to −1.6 V by increments of −0.25 V, for the p MOSFET transistor 3. Curves 50, 51, 52, 53, 54, 55 and 56 thus correspond to a supply voltage Vd equal to −0.1 V, −0.35 V, −0.6 V, −0.85 V, −1.1 V, −1.35 V and −1.6 V, respectively. Curves 60 to 66 show the evolution of the drain current Id as a function of the supply voltage Vg of the gate electrode 28, for a supply voltage Vd of the drain electrode 26, varying from +0.1 V to +1.6 V by +0.25 V increments, for the n MOSFET transistor 4. Curves 60, 61, 62, 63, 64, 65 and 66 thus correspond to a supply voltage Vd of the drain electrode 26 equal to +0.1 V, +0.35 V, +0.6 V, +0.85 V, +1.1 V, +1.35 V and +1.6 V, respectively.

In FIG. 8, curves 70 to 78 show the evolution of the drain current Id as a function of the supply voltage Vd of the drain electrode 12, for a supply voltage Vg of the gate electrode 14 varying from 0 V to −2 V by increments of −0.25 V, for the p MOSFET transistor 3. Curves 70, 71, 72, 73, 74, 75, 76, 77 and 78 thus correspond to a supply voltage Vg of the gate electrode 14 equal to 0 V, −0.25 V, −0.5 V, −0.75 V, −1 V, −1.25 V, −1.5 V, −1.75 V and −2 V. Curves 80 to 88 show the evolution of the drain current Id as a function of the supply voltage Vd of the drain electrode 26, for a supply voltage Vg of the gate electrode 28 varying from 0 V to +2 V by increments of +0.25 V, for the n MOSFET transistor 4. Curves 80, 81, 82, 83, 84, 85, 86, 87 and 88 thus correspond to a supply voltage Vg of the gate electrode 28 equal to 0 V, +0.25 V, +0.5 V, +0.75 V, +1 V, +1.25 V, +1.5 V, +1.75 V and +2 V, respectively.

In the absence of any supply voltage between the gate electrode 14, 28 and the source electrode 10, 24, each MOSFET transistor 3, 4 is in the off mode. Indeed, when the supply voltage Vg of the gate electrode 14, 28 is in the vicinity of 0 V, an additional barrier is created by the field effect developed by the gate electrode 14, 28 and prevents the current Id from circulating between the source electrode 10, 24 and the drain electrode 12, 26.

For the p transistor 3, when the supply voltage Vg of the gate electrode 14 is essentially equal to 0 V, the drain current Id circulating in the channel 20 is less than $3 \times 10^{-9}$ A/µm, regardless of the value of the supply voltage Vd between −0.1 V and −1.6 V, as shown in FIG. 7. For the n transistor 4, when the supply voltage Vg of the gate electrode 28 is substantially equal to 0 V, the drain current Id circulating in the channel 34 is substantially equal to $1 \times 10^{-8}$ A/µm for a supply voltage Vd equal to 0.1 V, and increases up to a value of about $3 \times 10^{-7}$ A/µm for a supply voltage Vd equal to +1.6 V, as shown in FIG. 7.

The p MOSFET transistor 3 is in the on mode for a negative supply voltage Vg between the gate electrode 14 and the source electrode 10. The n MOSFET transistor 4 is in the on mode for a positive supply voltage Vg between the gate electrode 28 and the source electrode 24. The supply voltages Vg of each gate electrode 14, 28 must also be greater in absolute value than a threshold value Vth, so that each transistor 3, 4 is in the on mode. A conduction layer of majority carriers present in the corresponding channel 20, 34 then connects the source electrode 10, 24 to the drain electrode 12, 26, allowing the current Id to circulate in the channel 20, 34.

The threshold voltage Vth depends mainly on the material of the gate electrode 14, 28.

In FIG. 8, the threshold voltage Vth of the p transistor 3 depends on the supply voltage Vd of the drain electrode 12, and is substantially equal to the supply voltage Vg corresponding to curve 73, i.e. −0.75 V. The threshold voltage Vth of the n transistor 4 depends on the supply voltage Vd of the drain electrode 26, and is substantially equal to the supply voltage Vg corresponding to curve 82, i.e. +0.5 V.

In FIG. 7, the threshold voltages Vth correspond to the x-axis of the point of intersection between the slope in transient mode and the asymptote in saturated mode for each curve, as indicated for curves 50 and 60. Graphically, the threshold voltage Vth_50 for curve 50 is substantially equal to −0.75 V and the threshold voltage Vth_60 for curve 60 is in the vicinity of +0.6 V, which corresponds to the values previously deduced from the curves of FIG. 8. It also emerges from FIGS. 7 and 8 that increasing the supply voltage Vd of the drain electrode 12, 26 causes a slight decrease in the threshold voltage Vth.

In FIG. 7, the drain current Id circulating in saturated mode in the channel 20 of the p transistor 3 is substantially between $3 \times 10^{-5}$ A/µm for a supply voltage Vd of the drain electrode 12 equal to −0.1 V (curve 50), and $4.4 \times 10^{-4}$ A/µm for a supply voltage Vd of the drain electrode 12 equal to −1.6 V (curve 56). The drain current Id circulating in saturated mode in the channel 34 of the n transistor 4 varies substantially identically to the drain current Id in saturated mode of the p transistor 3, and is between $4\times10^{-5}$ A/μm for a supply voltage Vd of the drain electrode 26 equal to 0.1 V (curve 60), and $7.1\times10^{-4}$ A/μm for a supply voltage Vd of the drain electrode 26 equal to +1.6 V (curve 66).

The slope under the threshold for the p transistor 3 is substantially equal to 12 decade/V, and the slope under the threshold for the n transistor 4 is substantially equal to 9 decade/V, as shown by FIG. 7.

In the on mode, when the absolute value of the supply voltage Vg of the gate electrode 14, 28 is greater than the threshold value Vth, the electrostatic barrier disappears and the remaining Schottky barrier is thinned due to the strong accumulation of carriers in the channel 20, 34. A small Schottky barrier height, ideally in the vicinity of 0eV, is then preponderant to obtain good electrical performance with the MOSFET transistors 3, 4 with Schottky source 10, 24 and drain 12, 26 transistors.

Figure 9:
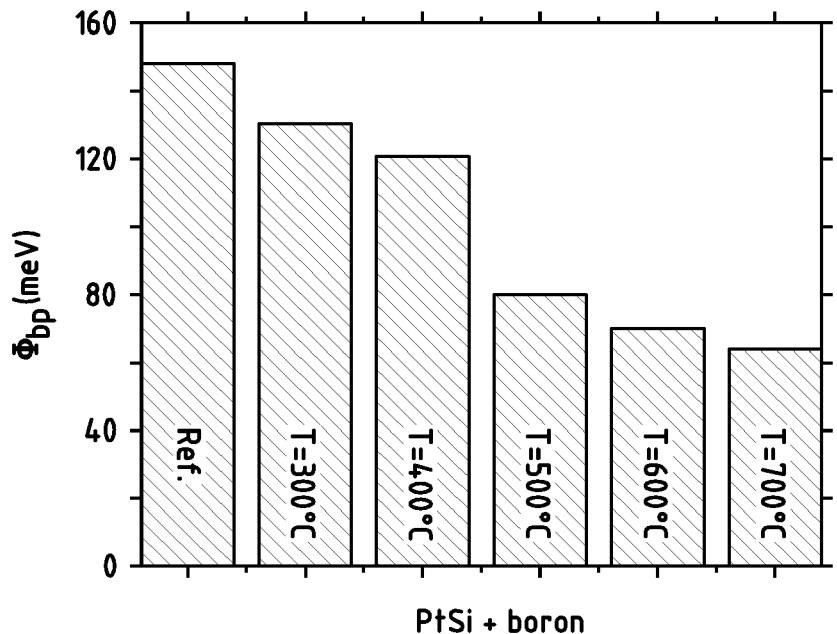
FIG. 9 is a results diagram showing the evolution of the Schottky barrier height for the holes in the p transistor after segregation of boron impurities, as a function of the annealing temperature, according to the first embodiment of the disclosure.

FIG. 9 shows the evolution of the height of the Schottky barrier for the p MOSFET transistor 3 as a function of the annealing temperature. The Schottky barrier height for the holes decreases considerably when the annealing temperature increases up to a temperature of 500° Celsius. For an annealing temperature beyond 500° Celsius, the Schottky barrier height for the holes decreases slightly from 0.08 eV for an annealing temperature equal to 500° Celsius, to 0.065 eV for an annealing temperature equal to 700° Celsius. Thus, the annealing temperature will preferably be equal to 500° Celsius.

Figure 10:
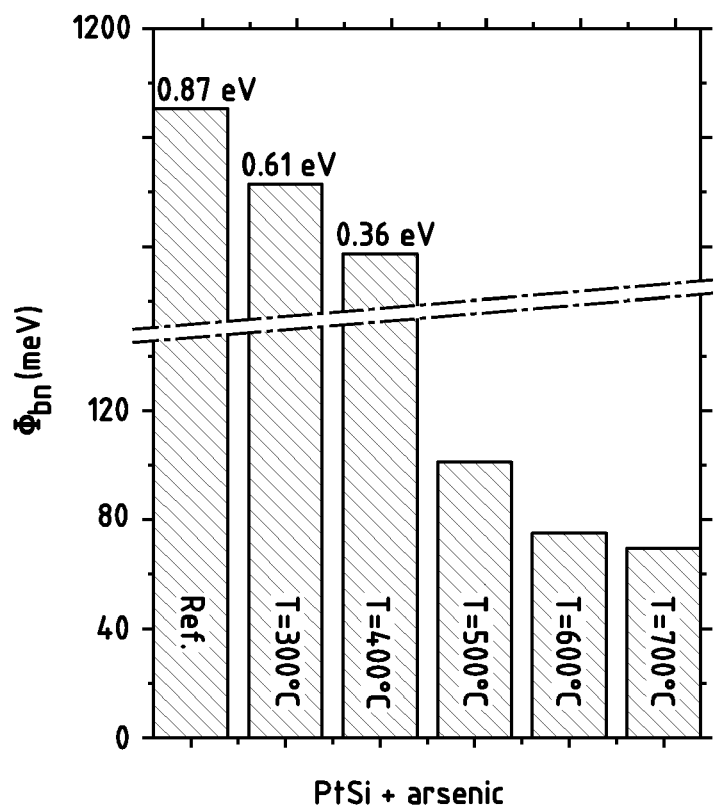
FIG. 10 is a results diagram showing the evolution of the Schottky barrier height for the electrons in the n transistor after segregation of arsenic impurities, as a function of the annealing temperature, according to the first embodiment of the disclosure.

In FIG. 10, the evolution of the height of the Schottky barrier for the n MOSFET transistor 4 as a function of the annealing temperature, shows a very clear decrease in the Schottky barrier height for the electrons when the annealing temperature increases to 600° Celsius. For an annealing temperature beyond 600° Celsius, the Schottky barrier height for the electrons decreases slightly from 0.075 eV for an annealing temperature equal to 600° Celsius, to 0.07 eV for an annealing temperature equal to 700° Celsius. Thus, the annealing temperature for the n MOSFET transistor 4 will preferably be equal to 600° Celsius.

Thus, the step of segregating impurities is done in an unique step for the p and n MOSFET transistors 3, 4 at a low annealing temperature of less than 700° C., preferably equal to 600° Celsius.

Advantageously, the electronic device 2 according to the disclosure makes it possible to obtain a better level of electronic performance, as described previously using FIGS. 7 and 8.

Advantageously, the electronic device 2 according to the disclosure makes it possible to significantly decrease the Schottky barrier for the source 10, 24 and drain 12, 26 electrodes of the complementary MOSFET transistors 3, 4.

For the p MOSFET transistor 3, a Schottky barrier height less than or equal to 0.08 eV is obtained for an annealing temperature greater than or equal to 500° Celsius, which is significantly below the typical values of Schottky barrier heights for the p MOSFET transistors of the prior art, i.e. about 0.15 eV.

For the n MOSFET transistor 4, a Schottky barrier height less than or equal to 0.075 eV is obtained for an annealing temperature greater than or equal to 600° Celsius, which is significantly less than the typical values of Schottky barrier heights for the n MOSFET transistors of the prior art, i.e. 0.2 eV to 0.25 eV.

Advantageously, the step of forming the silicide is simplified significantly with the production method according to the disclosure. The single silicide is, in fact, formed through a single step, whereas the production method of the prior art using two different silicides involves several steps for forming the silicides, i.e. a deposition step, an activation step and a specific selective removal step, for each of the two types of silicide, which is significantly more complex than the production method according to the disclosure.

Advantageously, the production method according to the disclosure does not require the integration of rare earths into the silicide for the n transistor 4, which also simplifies the step for forming the silicide, which does not need to be done in an ultravacuum.

Figure 11:
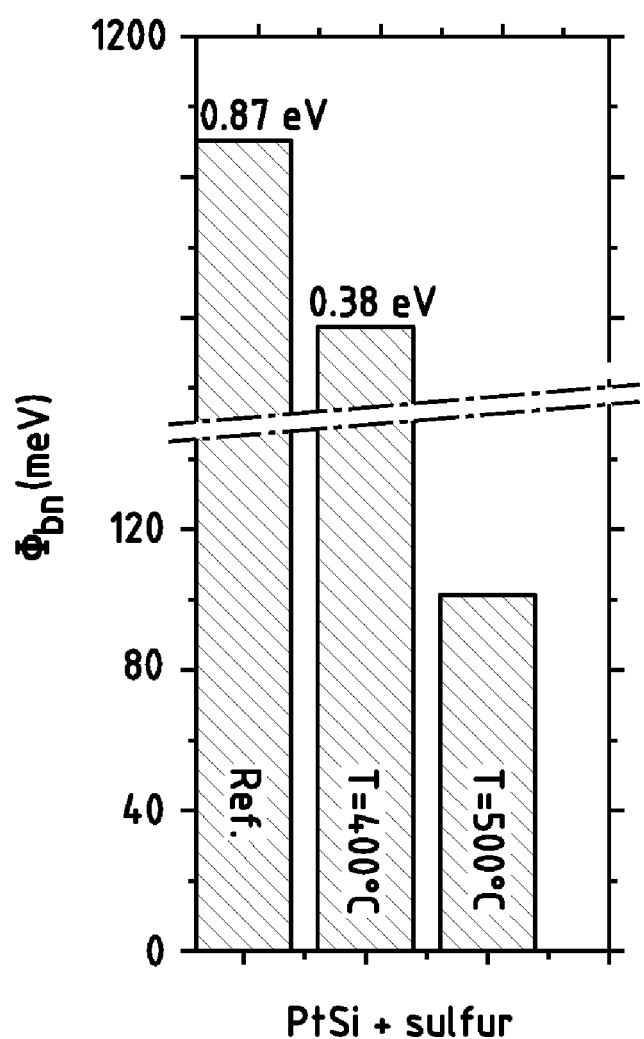
FIG. 11 is a results diagram showing the evolution of the Schottky barrier height for the electrons in the n transistor after segregation of sulfur impurities, as a function of the annealing temperature, according to the second embodiment of the disclosure.

FIG. 11 illustrates a second embodiment, for which the elements similar to the embodiment previously described are noted using identical references.

According to the second embodiment, the second impurities 35 confined in the zones of the source 24 and drain 26 electrodes of the n MOSFET transistor 4 are sulfur atoms. Sulfur is a double donor and belongs to group VI of the periodic table.

In FIG. 11, the evolution of the Schottky barrier height for the n MOSFET transistor 4 as a function of the annealing temperature, shows a very clear decrease of the Schottky barrier height for the electrons when the annealing temperature increases to 500° Celsius. For an annealing temperature equal to 500° Celsius, the Schottky barrier height is substantially equal to 0.1 eV. Thus, the annealing temperature for the n MOSFET transistor will preferably be equal to a 500° Celsius.

Thus, the step of segregating impurities is done only for the p and n MOSFET transistors 3, 4 at a low annealing temperature of less than 700° C., preferably equal to 500° Celsius according to the second embodiment.

The operation of this second embodiment is identical to that of the first embodiment and is therefore not described again.

Advantageously, the electronic device 2 according to the disclosure makes it possible to significantly decrease the Schottky barrier for the source 24 and drain 26 electrodes of the MOSFET transistor 4 by segregating impurities from group VI of the periodic table, made up of double donors.

Similarly advantageously, the electronic device 2 according to the disclosure makes it possible to significantly decrease the Schottky barrier for the source 10 and drain 12 electrodes of the MOSFET transistor 3 by segregating impurities from group II of the periodic table, made up of double acceptors.

Figure 12:
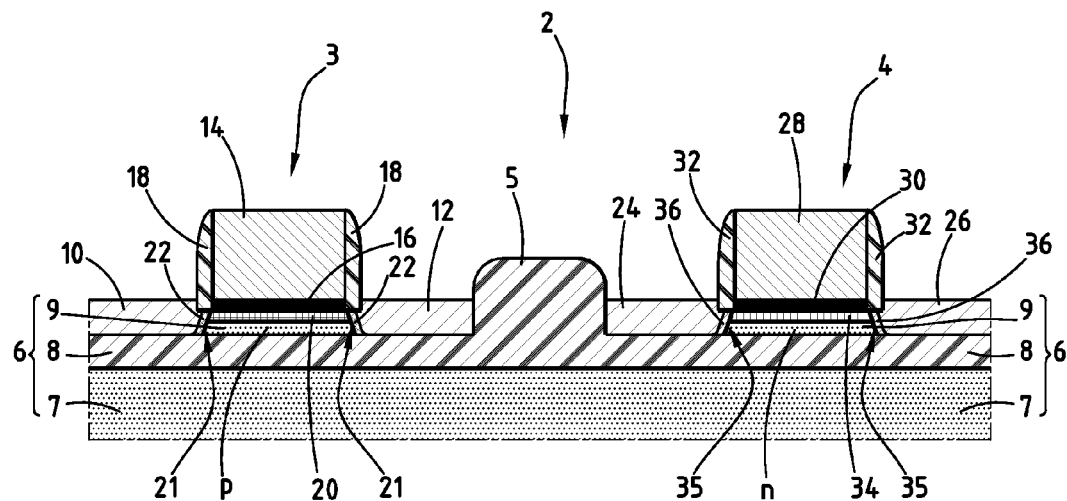
FIG. 12 is a diagrammatic cross-sectional illustration of the electronic device for the silicon on insulator substrate, the silicide having consumed the entire silicon film, according to a third embodiment of the disclosure.
Figure 13:
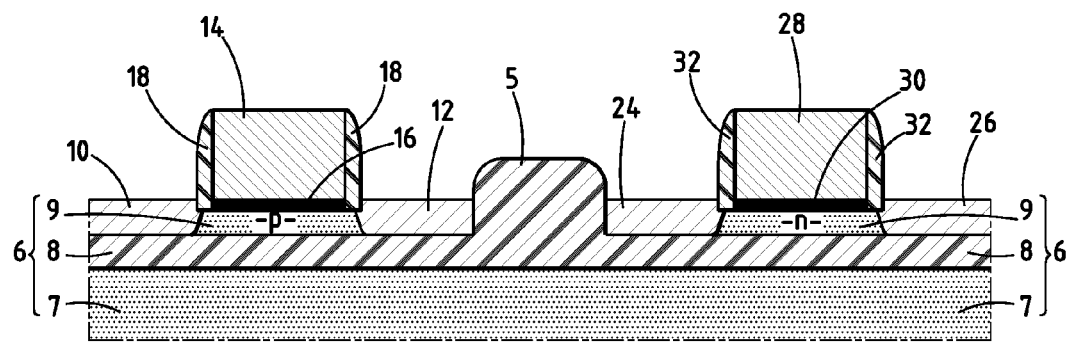
FIG. 13 is a diagrammatic illustration of the step for formation of the single silicide of the source and drain electrodes, of the production method according to the third embodiment of the disclosure.

FIGS. 12 and 13 illustrate a third embodiment, for which the elements similar to the first embodiment previously described are indicated using identical references.

In FIG. 12, the single silicide of the source 10, 24 and drain 12, 26 electrodes of the p and n transistors 3, 4 of the electronic device 2, is in contact with the insulating layer 8 of the SOI substrate 6.

The production method in fact differs from the production method described for the first embodiment by the step of forming the silicide shown in FIG. 13. During the step of forming the single silicide for this third embodiment, the silicide consumes the entire active layer 9 of silicon situated in the zones of the source 10, 24 and drain 12, 26 electrodes. After formation of the single silicide, the source 10, 24 and drain 12, 26 electrodes are thus in contact with the silica insulating layer 8 of the SOI substrate 6. The weakly doped active layer 9 remains present in a zone situated under the gate electrode 14, 28.

The operation of this third embodiment is identical to that of the first embodiment and is therefore not described again.

Figure 14:
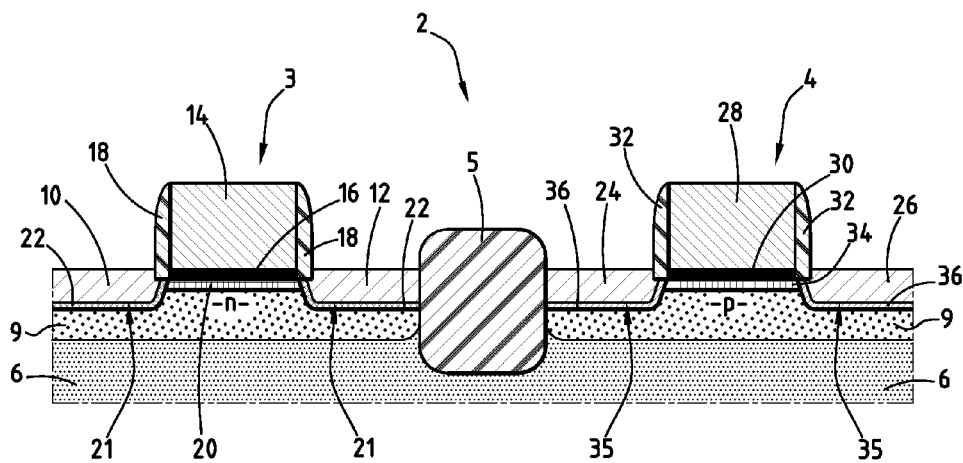
FIG. 14 is a diagrammatic and cross-sectional illustration of the electronic device for a substrate in solid silicon, according to a fourth embodiment of the disclosure.
Figure 15:
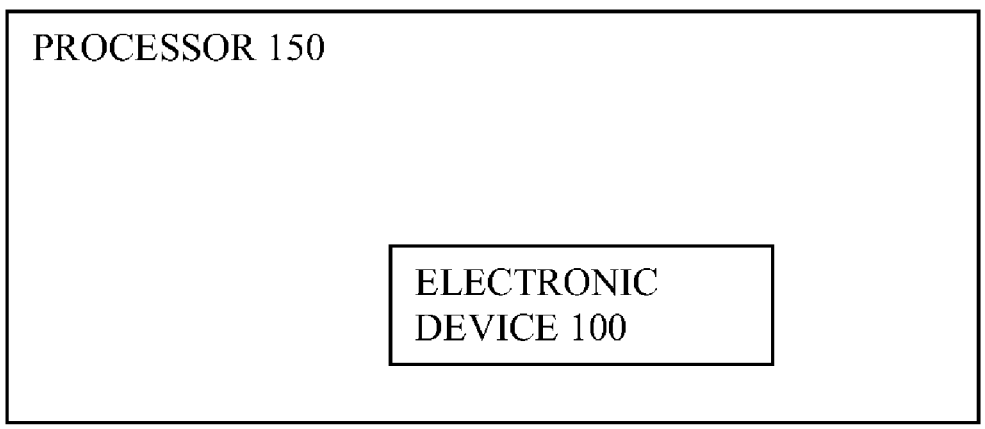
FIG. 15 is a diagrammatic illustration of the electronic device incorporated in a processor according to an embodiment of the disclosure.

FIG. 14 illustrates a fourth embodiment, for which the elements similar to the first embodiment previously described are indicated using identical references.

The p MOSFET transistor 3 and the n MOSFET transistor 4 of the electronic device 2 are made on a solid silicon substrate 6. Each MOSFET transistor 3, 4 includes, in the upper portion of the solid silicon substrate 6, a slightly doped active layer 9 also called well, the concentration of the doping being in the vicinity of $10^{15}$ to $10^{17}$ $cm^{-3}$. The doping of the well 9 is type n for the p MOSFET transistor 3, and the doping of the well 9 is type p for the n MOSFET transistor.

The depth of the insulating zone 5 is capable of preventing any migration of holes of the well 9 of the p MOSFET transistor 3 toward the n MOSFET transistor 4, and conversely any migration of electrons from the well 9 of the n MOSFET transistor 4 toward the p MOSFET transistor 3.

The operation of this fourth embodiment is identical to the known operation of a depletion MOS transistor.

According to another embodiment, the substrate 6 is a silicon-on-nothing substrate.

According to another embodiment, the substrate 6 is a germanium-based substrate.

According to another embodiment, the gate electrode 14 is made of polysilicon.

According to another embodiment, the insulating layers 16, 30 are made of a dielectric material with a high dielectric constant (HK), such as hafnium oxide ($HfO_2$), the silicate of hafnium oxide (HfOSi), or lanthanum aluminate ($LaAlO_3$).

According to another embodiment, the segregation of the impurities 21, 35 at the interface between the silicide of the source 10, 24 and drain 12, 26 electrodes, and the channel 20, 34 is done by an implantation to metal (ITM), for any substrate type.

Implantation to metal consists of confining the impurities 21, 35 in the metal by ion implantation, then having the impurities 21, 35 segregated at the interface between the silicide and the corresponding channel 20, 34 through an activation done during the step of forming the silicide.

According to another embodiment, the segregation of the impurities 21, 35 between the silicide of the source 10, 24 and drain 12, 26 electrodes, and the channel 20, 34 is done through implantation before silicide (IBS), for any substrate type.

Implantation before silicide consists of implanting the impurities 21, 35 over a small thickness of the silicon of the substrate 6, located near the upper face of the substrate 6, then forming the single silicide of the source 10, 24 and drain 12, 26 electrodes, in order to consume the entire thickness of the implanted layer. The impurities 21, 35 segregate at the interface between the silicide and the channel 20, 34 during the step of forming the silicide.

According to another embodiment, the single silicide is an alloy comprising silicon and platinum.

According to another embodiment, the single silicide is an alloy comprising nickel and silicon.

According to another embodiment, first impurities 21 of aluminum, gallium, or indium are segregated at the interface between the silicide and the channel 20 to produce source 10 and drain 12 electrodes of the p MOSFET transistor 3.

According to another embodiment, first impurities 21 of beryllium, magnesium, calcium, strontium, or barium are segregated at the interface between the silicide and the channel 20 to produce source 10 and drain 12 electrodes of the p MOSFET transistor 3.

According to another embodiment, second impurities 35 of phosphorus or antimony are segregated at the interface between the silicide and the channel 34 to make source 24 and drain 26 electrodes of the n MOSFET transistor 4.

According to another embodiment, second impurities 35 of selenium or tellurium are segregated at the interface between the silicide and the channel 34, to make source 24 and drain 26 electrodes of the n MOSFET transistor 4.

According to another embodiment, the channels 20, 34 are strained channels made by using a strain Silicon on Insulator (sSOI) substrate.

According to another embodiment, the channels 20, 34 are strain channels made by selective epitaxy of the zones of the source 10, 24 and drain 12, 26 electrodes.

According to another embodiment, the channels 20, 34 are strained channels made using a strained layer of dielectric material, for example a layer of strained nitride, or a layer of strained oxide.

According to another embodiment, the channels 20, 34 are flanged channels.

According to another embodiment, the channels 20, 34 are nanowire-based channels.

One thus sees that the electronic device according to the disclosure makes it possible to minimize the specific contact resistances of the source and drain electrodes of each p and n MOSFET transistor, due to the significant decrease of the Schottky barrier height for said source and drain electrodes of each transistor.

One also sees that the method for making the electronic device according to the disclosure is noticeably simplified, through the use of a single silicide to make source and drain electrodes of complementary MOSFET transistors. The use of a silicide without element from the group of rare earths also contributes to simplifying the production method according to the disclosure.

The invention claimed is:

1. A method for making complementary p and n MOSFET transistors, with metal Schottky source and drain electrodes arranged on a semiconductor substrate, the source and drain electrodes of each transistor being connected by a channel controlled by a gate electrode, the method comprising:
    selecting the substrate from the group consisting of: solid silicon, silicon on insulator, and silicon on nothing;
    making the source and drain electrodes from a single silicide for both the p and n transistors, arranged on the semiconductor substrate;
    segregating first impurities from groups II and III of the periodic table, at the interface between the silicide and the channel of the p transistor, to make source and drain electrodes of the p transistor, the complementary n transistor being masked; and
    segregating second impurities from groups V and VI of the periodic table, at the interface between the silicide and the channel of the n transistor, to make source and drain electrodes of the n transistor, the complementary p transistor being masked,
    wherein the segregation of the first and second impurities is performed by an implantation to silicide, and the first and second impurities are segregated at the interface between the silicide and the channel through an activation by annealing at a temperature below 700° C.

2. A method for making complementary p and n MOSFET transistors, with metal Schottky source and drain electrodes arranged on a semiconductor substrate, the source and drain electrodes of each transistor being connected by a channel controlled by a gate electrode, the method comprising:
    selecting the substrate from the group consisting of: solid silicon, silicon on insulator, and silicon on nothing;

making the source and drain electrodes from a single silicide for both the p and n transistors, arranged on the semiconductor substrate;

segregating first impurities from groups II and III of the periodic table, at the interface between the silicide and the channel of the p transistor, to make source and drain electrodes of the p transistor, the complementary n transistor being masked; and segregating second impurities from groups V and VI of the periodic table, at the interface between the silicide and the channel of the n transistor, to make source and drain electrodes of the n transistor, the complementary p transistor being masked, wherein the segregation of the first and second impurities is performed by an implantation before silicide, and the first and second impurities being segregated at the interface between the silicide and the channel during formation of the single silicide.

3. The method according to any one of claims 1 to 2, wherein the single silicide is an alloy comprising nickel and silicon.

4. The method according to any one of claims 1 to 2, further comprising the selection of a technology for making the channel from the group consisting of: a non-strained channel, a channel strained by the use of a strained silicon on insulator substrate, a channel strained by selective epitaxy of source and drain zones, a channel with a strained layer of dielectric material, a flanged channel, and a nanowire-based channel.

5. The method according to any one of claims 1 to 2, wherein, for the p transistors, the selection of the first impurities from the list of elements of group II consisting of:
beryllium, magnesium, calcium, strontium and barium.

6. The method according to any one of claims 1 to 2, wherein, for the p transistors, the selection of the first impurities from the list of elements of group III consisting of:
boron, aluminum, gallium and indium.

7. The method according to any one of claims 1 to 2, wherein, for the n transistors, the selection of the second impurities from the list of elements of group V consisting of: phosphorous, arsenic and antimony.

8. The method according to any one of claims 1 to 2, wherein, for the n transistors, selecting second impurities from the list of elements of group VI consisting of: sulfur, selenium and tellurium.

9. The method according to any one of claims 1 to 2, wherein the concentration of the segregated first and second impurities is between $5 \times 10^7/cm^3$ and $5 \times 10^{21}/cm^3$.

10. The method according to claim 1, further comprising:
implanting the first impurities, formed by an element from groups II and III of the periodic table of elements, in the silicide to make source and drain electrodes of the p transistor, the complementary n transistor being masked;
implanting the second impurities, formed from an element from groups V and VI of the periodic table of elements, in the silicide to make the source and drain electrodes of the n transistor, the complementary p transistor being masked; and
segregating the first and second impurities at the interface between the silicide and the channel via an activation by low-temperature annealing.

11. A method for making complementary p and n MOSFET transistors, with metal Schottky source and drain electrodes arranged on a semiconductor substrate, the source and drain electrodes of each transistor being connected by a channel controlled by a gate electrode, the method comprising:
selecting the substrate from the group consisting of: solid silicon, silicon on insulator, and silicon on nothing;
making the source and drain electrodes from a single silicide for both the p and n transistors, arranged on the semiconductor substrate;
segregating first impurities from groups II and III of the periodic table, at the interface between the silicide and the channel of the p transistor, to make source and drain electrodes of the p transistor, the complementary n transistor being masked;
segregating second impurities from groups V and VI of the periodic table, at the interface between the silicide and the channel of the n transistor, to make source and drain electrodes of the n transistor, the complementary p transistor being masked,
wherein the segregation of the first and second impurities is performed by an implantation to metal, and the first and second impurities are segregated at the interface between the silicide and the channel during formation of the single silicide.

12. The method according to any one of claims 1 to 2, wherein the single silicide is an alloy comprising silicon and platinum.

13. An electronic device, of the type comprising at least one p transistor and at least one n transistor, each of the transistors including a metal Schottky source electrode and drain electrode, formed from a silicide arranged on a semiconductor substrate, the source and drain electrodes of each transistor being connected by a channel controlled by a gate electrode, there being a single silicide for the source and drain electrodes of the p and n transistors, the source and drain electrodes of the p transistor comprising first impurities segregated at the interface between the silicide and the channel of the p transistor, the first impurities being elements from groups II and III of the periodic table, and the source and drain electrodes of the n transistor comprising second impurities segregated at the interface between the silicide and the channel of the n transistor, the second impurities being elements from groups V and VI of the periodic table, characterized in that it is obtained through a production method according to any one of claims 1 to 2.

14. A processor characterized in that it includes at least one electronic device according to claim 13.

* * * * *